(12) United States Patent
Ng et al.

(10) Patent No.: US 10,784,410 B2
(45) Date of Patent: Sep. 22, 2020

(54) MOLECULAR COATINGS OF NITRIDE SEMICONDUCTORS FOR OPTOELECTRONICS, ELECTRONICS, AND SOLAR ENERGY HARVESTING

(71) Applicant: King Abdullah University of Science and Technology, Thuwal (SA)

(72) Inventors: Tien Khee Ng, Thuwal (SA); Chao Zhao, Thuwal (SA); Davide Priante, Thuwal (SA); Boon S. Ooi, Thuwal (SA); Mohamed Ebaid Abdrabou Hussein, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/315,081

(22) PCT Filed: Jul. 25, 2017

(86) PCT No.: PCT/IB2017/054514
§ 371 (c)(1),
(2) Date: Jan. 3, 2019

(87) PCT Pub. No.: WO2018/020422
PCT Pub. Date: Feb. 1, 2018

(65) Prior Publication Data
US 2019/0214531 A1    Jul. 11, 2019

Related U.S. Application Data

(60) Provisional application No. 62/366,950, filed on Jul. 26, 2016.

(51) Int. Cl.
*H01L 33/56* (2010.01)
*H01L 33/44* (2010.01)
(Continued)

(52) U.S. Cl.
CPC ............. *H01L 33/44* (2013.01); *C25B 1/003* (2013.01); *C25B 1/04* (2013.01); *H01L 31/0216* (2013.01);
(Continued)

(58) Field of Classification Search
CPC ............. H01L 33/44; H01L 31/02161; H01L 31/02167; H01L 31/02168; H01L 31/1868;
(Continued)

(56) References Cited

U.S. PATENT DOCUMENTS 4,935,384 A    6/1990  Wanlass
8,669,544 B2   3/2014  Mi et al.
(Continued)

FOREIGN PATENT DOCUMENTS

JP    H10209072 A     8/1998
KR    20110077449 A   7/2011
(Continued)

OTHER PUBLICATIONS

Alotaibi, et al., "A Metal-Nitride Nanowire Dual-Photoelectrode Device for Unassisted Solar-to-Hydrogen Conversion under Parallel Illumination", Nano Letters, 2015, 6821-6828.
(Continued)

*Primary Examiner* — Caridad Everhart
(74) *Attorney, Agent, or Firm* — Billion & Armitage; Gregory S. Schwartz

(57) ABSTRACT

Gallium nitride based semiconductors are provided having one or more passivated surfaces. The surfaces can have a plurality of thiol compounds attached thereto for enhancement of optoelectronic properties and/or solar water splitting properties. The surfaces can also include wherein the surface has been treated with chemical solution for native oxide removal and/or wherein the surface has attached thereto a
(Continued)

1A  1B  1C  1D plurality of nitrides, oxides, insulating compounds, thiol compounds, or a combination thereof to create a treated surface for enhancement of optoelectronic properties and/or solar water splitting properties. Methods of making the gallium nitride based semiconductors are also provided. Methods can include cleaning a native surface of a gallium nitride semiconductor to produce a cleaned surface, etching the cleaned surface to remove oxide layers on the surface, and applying single or multiple coatings of nitrides, oxides, insulating compounds, thiol compounds, or a combination thereof attached to the surface.

20 Claims, 4 Drawing Sheets

(51) Int. Cl.
| | |
|---|---|
| C25B 1/00 | (2006.01) |
| H01L 31/0216 | (2014.01) |
| C25B 1/04 | (2006.01) |
| H01L 31/18 | (2006.01) |
| H01L 31/0304 | (2006.01) |
| H01L 33/20 | (2010.01) |
| H01L 33/32 | (2010.01) |

(52) U.S. Cl.
CPC .. *H01L 31/02161* (2013.01); *H01L 31/02167* (2013.01); *H01L 31/02168* (2013.01); *H01L 31/1868* (2013.01); *H01L 31/03044* (2013.01); *H01L 31/03048* (2013.01); *H01L 33/20* (2013.01); *H01L 33/32* (2013.01); *H01L 2933/0025* (2013.01); *Y02P 20/134* (2015.11)

(58) Field of Classification Search
CPC . H01L 31/7868; H01L 31/0216; H01L 33/32; H01L 51/0003; H01L 31/03048; H01L 31/03044; H01L 31/32; H01L 2933/0025; B82Y 30/00; B82Y 20/00; B82Y 40/00; C09K 11/62; C09K 11/02; C08L 81/02; C25B 1/003; C25B 1/04
See application file for complete search history.

(56) References Cited

U.S. PATENT DOCUMENTS

| | | | | |
|---|---|---|---|---|
| 2010/0133110 | A1* | 6/2010 | Nocera | C25B 1/003 205/340 |
| 2012/0018774 | A1* | 1/2012 | Taylor | B82Y 30/00 257/103 |
| 2012/0270231 | A1* | 10/2012 | Smith | C09K 11/02 435/7.2 |
| 2015/0064105 | A1 | 3/2015 | Takanabe et al. | |
| 2015/0098212 | A1 | 4/2015 | Youn | |
| 2015/0315463 | A1 | 11/2015 | Mami | |
| 2015/0344825 | A1* | 12/2015 | Cooper | C11D 3/0073 510/175 |
| 2016/0027961 | A1 | 1/2016 | Mi et al. | |
| 2017/0306227 | A1* | 10/2017 | Ippen | C09K 11/70 |

FOREIGN PATENT DOCUMENTS

| | | |
|---|---|---|
| KR | 20130021301 A | 3/2013 |
| WO | 2016/015134 | 2/2016 |

OTHER PUBLICATIONS

Alotaibi, et al., "Highly Stable Photoelectrochemical Water Splitting and Hydrogen Generation Using a Double-Band InGaN/GaN Core/Shell Nanowire Photoanode", Nano Letters, 2013, 4356-4361.

Alotaibi, et al., "Highly Stable Photoelectrochemical Water Splitting and Hydrogen Generation Using a Double-Band InGaN/GaN Core/Shell Nanowire Photoanode", Nano Letters, Jun. 13, 2013, 4356-4361.

Armstrong, et al., "GaN nanowire surface state observed using deep level optical spectroscopy", American Institute of Physics, 2010, 1-4.

Calarco, "Surface-induced effects in GaN nanowires", Materials Research Society, 2011, 2157-2168.

Calarco, et al., "Surface-induced effects in GaN nanowires", Sep. 14, 2011, 2157-2168.

Chia, et al., "Electrical transport and optical model of GaAs—AlInP core-shell nanowires", American Institute of Physics, 2012, 1-7.

Elafandy, et al., "Exfoliation of Threading Dislocation-Free, Single-Crystalline, Ultrathin Gallium Nitride Nanomembranes", Adv. Fund. Mater., 2014, 2305-2311.

Elafandy, et al., "Exfoliation of Threading Dislocation-Free, Single-Crystalline, Ultrathin Gallium Nitride Nanomembranes", Advanced Functional Materials, 2014, 2305-2311.

Fang, et al., "Band gap engineering of GaN nanowires by surface functionalization", American Institute of Physics, 2009, 1-4.

Frost, et al., "Monolithic Electrically Injected Nanowire Array Edge-Emitting Laser on (001) Silicon", Nano Letters, American Chemical Society, 2014, 4535-4541.

Frost, et al., "Monolithic Electrically Injected Nanowire Array Edge-Emitting Laser on (001) Silicon", Nano Letters, American Chemical Society Publications, 2014, 4535-4541.

Guo, et al., "InGaN/GaN disk-in-nanowire white light emitting diodes on (001) silicon", American Institute of Physics, 2011, 1-4.

Hsu, et al., "Optical properties of functionalized GaN nanowires", American Institute of Physics, 2011, 1-7.

Hwang, et al., "Biodegradable Elastomers and Silicon Nanomembranes/ Nanoribbons for Stretchable, Transient Electronics, and Biosensors", Nano Letters, American Chemical Society, 2015, 2801-2808.

Jahangir, et al., "Small signal modulation characteristics of red-emitting ($\lambda$=610 nm) III-nitride nanowire array lasers on (001) silicon", AIP Publishing LLC., 2015, 1-5.

Jahangir, et al., "Small signal modulation characteristics of red-emitting ($\lambda$=610 nm) III-nitride nanowire array lasers on (001) silicon", Application Physics Letters, 2015, 1-5.

Khan, et al., "Enhanced Optoelectronic Performance of a Passivated Nanowire-Based Device: Key Information from Real-Space Imaging Using 4D Electron Microscopy", Nano Small Micro, 2016, 2313-2320.

Khan, et al., "Enhanced Optoelectronic Performance of a Passivated Nanowire-Based Device: Key Information from Real-Space Imaging Using 4D Electron Microscopy", Wiley-VCH Verlag GmbH & Co. KGaA, Weinheim, 2016, 2313-2320.

Kibria, et al., "One-Step Overall Water Splitting under Visible Light Using Multiband InGaN/GaN Nanowire Heterostructures", ACS Nano, 2013, 7886-7893.

Lahnemann, et al., "Radial Stark Effect in (In,Ga)N Nanowires", Nano Letters, 2016, 917-925.

Li, et al., "Ultralow-threshold electrically injected AlGaN nanowire ultraviolet lasers on Si operating at low temperature", Nature nanotechnology, 2015, 140-144.

Li, et al., "Ultralow-threshold electrically injected AlGaN nanowire ultraviolet lasers on Si operating at low temperature", nature nanotechnology, Feb. 2015, 140-144.

Nguyen, et al., "Breaking the Carrier Injection Bottleneck of Phosphor-Free Nanowire White Light-Emitting Diodes", Nano Letters, American Chemical Society, 2013, 5437-5442.

Pham Trung, et al., "Breaking the Carrier Injection Bottleneck of Phosphor-Free Nanowire White Light-Emitting Diodes", Nano Letters, American Chemical Society, 2013, 5437-5442.

Reece, et al., "Wireless Solar Water Splitting Using Silicon-Based Semiconductors and Earth-Abundant Catalysts", Science, Nov. 4, 2011, 645-648.

Suk-Won, et al., "Biodegradable Elastomers and Silicon Nanomembranes/ Nanoribbons for Stretchable, Transient Electronics, and Biosensors", American Chemical Society, 2015, 2801-2808.

(56) References Cited

OTHER PUBLICATIONS

Sun, et al., "Removal of Surface States and Recovery of Band-Edge Emission in InAs Nanowires through Surface Passivation", American Chemical Society, 2012, 3378-3384.

Wang, et al., "The Influence of Emitter Material on Silicon Nitride Passivation-Induced Degradation in InP-Based HBTs", IEEE Transactions on Electron Devices, Jan. 2004, 1-6.

Wang et al. "Wafer-Level Photocatalytic Water Splitting on GaN Nanowire Arrays Grown by Molecular Beam Epitaxy", Nano Letters, American Chemical Society, 2011, 2353-2357.

Wei, et al., "InGaN/GaN disk-in-nanowire white light emitting diodes on (001) silicon", Applied Physics Letters, 2011, 1-4.

Yablonovitch, et al., "Nearly ideal electronic properties of sulfide coated GaAs surfaces", American Institute of Physics., 1987, 439-441.

Yong Ho, et al., "Coaxial InxGa1-xN/GaN Multiple Quantum Well Nanowire Arrays on Si(111) Substrate for High-Performance Light-Emitting Diodes", Nano Letters, Mar. 11, 2013, 3506-3516.

Yong-Ho, et al., "Coaxial InxGa1-xN/GaN Multiple Quantum Well Nanowire Arrays on Si(111) Substrate for High-Performance Light-Emitting Diodes", Nano Letters, American Chemical Society, 2013, 3506-3516.

Zhao, et al., "An enhanced surface passivation effect in InGaN/ GaN disk-in-nanowire light emitting diodes for mitigating Shockley-Read-Hall recombination", Royal Society of Chemistry, 2015, 16658-16665.

Zhao, et al., "Facile Formation of High-Quality InGaN/GaN Quantum-Disks-in-Nanowires on Bulk-Metal Substrates for High-Power Light-Emitters", Nano Letters, American Chemical Society, 2016, 1056-1063.

Zhao, et al., "Facile Formation of High-Quality InGaN/GaN Quantum-Disks-in-Nanowires on Bulk-Metal Substrates for High-Power Light-Emitters", Nano Letters, American Chemical Society Publications, 2016, 1056-1063.

Zhao, et al., "Impacts of Thermal Atomic Layer-Deposited AlN Passivation Layer on GaN-on-Si High Electron Mobility Transistors", Springer, Nanoscale Research Letters, 2016, 1-5.

Notification of Transmittal of the International Search Report and the Written Opinion of the International Searching Authority, or the Declaration for PCT/IB2017/054514 dated Jul. 25, 2017.

\* cited by examiner

MOLECULAR COATINGS OF NITRIDE SEMICONDUCTORS FOR OPTOELECTRONICS, ELECTRONICS, AND SOLAR ENERGY HARVESTING

CROSS-REFERENCE TO RELATED APPLICATIONS

This application claims priority to, and the benefit of, U.S. provisional application entitled "MOLECULAR COATINGS OF NITRIDE SEMICONDUCTORS FOR OPTOELECTRONICS, ELECTRONICS, AND SOLAR ENERGY HARVESTING" having Ser. No. 62/366,950, filed Jul. 26, 2016.

TECHNICAL FIELD

The present disclosure generally relates to semiconductors and applications thereof.

BACKGROUND (Al,Ga,In)N nanowires and membranes structures and devices provide numerous advantages compared to planar multiple-quantum-wells and devices (Zetian, et al., "High efficiency broadband semiconductor nanowire devices and methods of fabricating without foreign catalysis", U.S. Pat. No. 8,669,544 B2, Feb. 10, 2011; Mi, et al, "Methods and devices for solid state nanowire devices", US 20160027961 A1 Mar. 14, 2014; Tarek, et al., Exfoliation of threading dislocation-free, Single-Crystalline, Ultrathin Gallium Nitride Nano Membrane", Advanced Functional Materials, 24:16, 2305-2311 2014.) These low dimensional nitride nanostructures suffers considerably less lattice-matching or thermal-matching growth constraint, less thermal-expansion mismatch fabrication constraint, zero threading dislocations, sub-MV/cm polarization fields or zero spontaneous polarization field, high light extraction efficiency, as it is less prone to the effect of total internal reflection (Ra, et al., "Coaxial InxGa1-xN/GaN Multiple Quantum Well Nanowire Arrays on Si(111) Substrate for High-Performance Light-Emitting Diodes", Nano Letters, 13, 3506-3516, 2013.) Hence they are suitable for practical devices. Light-emitting diodes [a4,a5,a6,a7] and laser diode [a8,a9] devices were fabricated without quantum-efficiency roll-over (droop-free) in the "green-gap" and beyond (Guo, et al., "InGaN/GaN disk-in-nanowire white light emitting diodes on (001) silicon," Applied Physics Letters, 98, 193102, 2011; Ra, et al. "Coaxial InxGa1-xN/GaN Multiple Quantum Well Nanowire Arrays on Si(111) Substrate for High-Performance Light-Emitting Diodes", Nano Letters, 13, 3506-3516, 2013; Li, et al., "Ultralow-threshold electrically injected AlGaN nanowire ultraviolet lasers on Si operating at low temperature," Nat Nano, vol. 10, pp. 140-144, 2015; Zhao, et al., "Facile Formation of High-Quality InGaN/GaN Quantum-Disks-in-Nanowires on Bulk-Metal Substrates for High-Power Light-emitters", Nano Lett. 16, 1056-1063, 2016; Frost, et al., "Monolithic Electrically Injected Nanowire Array Edge-Emitting Laser on (001) Silicon", Nano Lett., 14(8), 4535-4541, 2014; Jahangir, et al., "Small signal modulation characteristics of red-emitting (λ=610 nm) Ill-nitride nanowire array lasers on (001) silicon", Appl. Phys. Lett., 106, 071108 2015). The large specific surface, multiple-scattering events within the nanowires forest in enhancing light absorption, and hence desirable for photo-detector, solar-cell, and water-splitting applications (AlOtaibi, et al., "Highly Stable Photoelectrochemical Water Splitting and Hydrogen Generation Using a Double-Band InGaN/GaN Core/Shell Nanowire Photoanode", Nano Lett., 13:9, 4356-4361, 2013; AlOtaibi, et al., "A Metal-Nitride Nanowire Dual-Photoelectrode Device for Unassisted Solar-to-Hydrogen Conversion under Parallel Illumination", Nano Letters, 15:10, 6821-6828, 2015; Hwang, et al., "Biodegradable Elastomers and Silicon Nanomembranes/Nanoribbons for Stretchable, Transient Electronics, and Biosensors", Nano Letters, 15, 2801-2808, 2015). In the case of single-nanowire transistors and other devices, the large permittivity and bandgap properties is favorable for high speed, high power handling, high radiation hardness integrated circuits. The advent of stretchable or implantable electronics may also invoke these low dimensional structures for improved functionalities (AlOtaibi, et al., "A Metal-Nitride Nanowire Dual-Photoelectrode Device for Unassisted Solar-to-Hydrogen Conversion under Parallel Illumination", Nano Letters, 15:10, 6821-6828, 2015.)

There remain major obstacles in utilizing these nitride nanowires for optoelectronic and electronic applications related to the large specific surface, and therefore the high density of surface localized defect states, which originated from dangling bonds, nitrogen vacancies, and/or surface oxides (Armstrong, et al., "GaN nanowire surface state observed using deep level optical spectroscopy", Applied Physics Letters, 96(16) 163106, 2010; Calarco, et al., "Surface-induced effects in GaN nanowires", J. Mater. Res. 26, 2157-2168, 2011; Nguyen, et al., "Breaking the Carrier Injection Bottleneck of Phosphor-Free Nanowire White Light-Emitting Diodes", Nano Lett., 13(51), 437-5442, 2013). This results in surface Fermi level pinning and the subsequent energy-band bending near the sidewall, and results in Shockley-Read-Hall nonradiative recombination in light-emitting devices examined in our recent work [b4, b5], and indirect recombination related to radial Stark effect [b6] (Zhao, et al., "Enhanced Surface Passivation Effect in InGaN/GaN Disk-in-Nanowire Light Emitting Diodes for Mitigating Shockley-Read-Hall Recombination", Nanoscale 7, 16658-16665, 2015; Khan, et al., "Enhanced Optoelectronic Performance of a Passivated Nanowire-based Device: Key Information from Real-space Imaging using 4D Electron Microscopy", Small, 2016; Lahnemann, et al., "Radial Stark Effect in (In, Ga) N Nanowires", Nano Lett., 16 (2), pp. 917-925, 2016.) The surface-states capture the minority carriers generated within the nanowires forest thereby reducing the performance of light-emitting diodes (LEDs), lasers, solar cells, photodetectors, and photoelectrodes used in water splitting.

Semiconductor or semiconductor shell layers, and dielectric were typically used to encapsulate the semiconductor surfaces to mitigate surface state effect (Wanlass, et al., "Method of passivating semiconductor surfaces", U.S. Pat. No. 4,935,384, Jun. 19, 1990; Chia, et al., "Electrical Transport and Optical Model of GaAs AlInPCore-Shell Nanowires", J. Appl. Phys., 111, 094319, 2012). The methods were demonstrated on silicon, GaAs, InP, InAs, or GaN based surfaces or devices (Wang, et al., "The influence of emitter material on silicon nitride passivation-induced degradation in InP-based HBTs", IEEE Transactions on Electron Devices, 51:1, 8-13, 2004; Sun, et al., "Removal of Surface States and Recovery of Band-Edge Emission in InAs Nanowires through Surface Passivation", Nano Letters, vol. 12, pp. 3378-3384, 2012; Yablonovitch, et al., "Nearly ideal electronic properties of sulfide coated GaAs surfaces", Applied Physics Letters, 51, 439, 1987; Mi, et al., "Methods and devices for solid state nanowire devices", US 20160027961 A1 Mar. 14, 2014; Zhao, et al., "Impacts of Thermal Atomic Layer-Deposited AlN Passivation Layer on GaN-on-Si High Electron Mobility Transistors", Nanoscale Research Letters, 11:137, 2016. The dielectric layers, in some studies involved dielectric layers deposition, such as $SiO_2$, or SiN, or parylene, which also serve as electrical passivation (Mi, et al., "Methods and devices for solid state nanowire devices", US 20160027961 A1 Mar. 14, 2014). The process steps typically involve vacuum equipment, including plasma-enhanced chemical deposition, sputtering or thermal evaporation. These methods are time consuming and costly, as it typically involve gas introduction and pumping operation, as well as investment of capital equipment. These deposition methods do not provide conformal coating at molecular thickness. A low cost chemical treatment based on ammonium sulphide, or organic sulphides were demonstrated on InAs nanowires and GaAs surfaces and were typically applied in conjunction with the dielectric encapsulation for completing the passivation (Sun, et al., "Removal of Surface States and Recovery of Band-Edge Emission in InAs Nanowires through Surface Passivation", Nano Letters, vol. 12, pp. 3378-3384, 2012; Yablonovitch, et al., "Nearly ideal electronic properties of sulfide coated GaAs surfaces", Applied Physics Letters, 51, 439, 1987).

On nitride materials, the use of a similar organic passivation technique is limited and lacks detailed exploration, and does not exhibit the marked improvement obtained in the present technique; although the theoretical examination of the functionalization of hexagonal-shaped GaN nanowires with several chemical functional groups containing hydrogen were conducted to understand how the wires' electronic properties are affected by adsorption of H, $NH_2$, OH, and SH functional groups (Hsu, et al., "Optical properties of functionalized GaN nanowires", J. Appl. Phys. 109, 053523, 2011; Fang, et al., "Band gap engineering of GaN nanowires by surface functionalization", Applied Physics Letters, 94, 073116, 2009).

Although free-catalyst GaN nanowires have demonstrated a significant photocatalytic activity, $O_2$ and $H_2$ evolution can be enhanced using co-catalysts such as Pt and $Rh/Cr_2O_3$ core shell that not only ease the carrier migration towards the nanowires surface but also lessens the activation energy needed for gas evolution (AlOtaibi, et al., "Highly stable photoelectrochemical water splitting and hydrogen generation using a double-band InGaN/GaN core/shell nanowire photoanode." Nano letters 13.9, 2013: 4356-4361; AlOtaibi, et al. "A Metal-Nitride Nanowire Dual-Photoelectrode Device for Unassisted Solar-to-Hydrogen Conversion under Parallel Illumination." Nano Letters 15.10, 2015: 6821-6828; Wang, et al., "Wafer-level photocatalytic water splitting on GaN nanowire arrays grown by molecular beam epitaxy", Nano letters 11:6, 2353-2357, 2011; Kibria, et al., "One-Step Overall Water Splitting under Visible Light Using Multiband InGaN/GaN Nanowire Heterostructures", 7:9, 788607893, 2013; Mi, et al., "Methods and systems relating to photochemical water splitting", WO 2016/015134 A1). Among the techniques employed to deposit such co-catalysts, such as photodeposition methods and atomic layer deposition, enable attachment of co-catalyst lumps at the nanowires sidewalls (Reece, et al., Wireless solar water splitting using silicon-based semiconductors and earth-abundant catalysts." Science 334.6056, 2011): 645-648; Verlagel, et al., "A monolithically integrated, intrinsically safe, 10% efficient, solar-driven water-splitting system based on active, stable earth-abundant electrocatalysts in conjunction with tandem III-V light absorbers protected by amorphous $TiO_2$ films." Energy & Environmental Science 8:11, 2015: 3166-3172). These existing methods for catalyst formation do not lead to conformal and continuous molecular-coating thereby may affect charge transfer from nanowires or nanostructures to electrolyte for water splitting. The thick and layered-deposition (sputtering or atomic layer deposition) of precious metal, such as platinum or titanium oxide, does not facilitate low cost deposition of catalyst for water splitting. Existing water splitting methods do not claim for simultaneous passivation of dangling bonds or surface states in nitride nanostructures (Mi, et al., "Methods and systems relating to photochemical water splitting", WO 2016/015134 A1; Takanabe, et al., "Tethered transition metals promoted photocatalytic system for efficient hydrogen evaluations", Mar. 5, 2015, US patent 2015/0064105 A1).

There remains a need for improved semiconductors with surface passivation and methods of making thereof to alleviate some of the aforementioned deficiencies.

SUMMARY

A variety of semiconductors are provided having a plurality of thiol compounds passivating a surface of the semiconductor. In various aspects, a gallium based semiconductor is provided having a surface having attached thereto a plurality of thiol compounds. Gallium nitride based semiconductors are particularly useful in a variety of applications because the thiol compounds will readily bind to Gallium atoms, or group-III atoms in general, on the surface of the semiconductor. A variety of thiol compounds can be used depending upon the application. The compounds can be monothiols or dithiols. In various aspects, the thiol compounds are monothiols or dithiols having from 2 to 20 carbon atoms. The thiol compounds can include, but are certainly not limited to, 1,2-ethanedithiol (EDT), ammonium sulfide, octadecanethiol (ODT), 1-Pentanethiol, 1-Nonanethiol, derivatives thereof, and combinations thereof.

A variety of semiconductors are provided wherein a surface has been treated with chemical solution for native oxide removal and/or wherein the surface has attached thereto a plurality of nitrides, oxides, insulating compounds, thiol compounds, or a combination thereof to create a treated surface for enhancement of optoelectronic properties and/or solar water splitting properties. In some aspects, the treated surface allows for one or more of improved light extraction, electrical insulation, surface states passivation, charge carriers flow promotion/inhibition, and thermal dissipation.

In various aspects, the surface has been treated with chemical solution for native oxide removal. For example, the chemical solution for oxide removal can be selected from the group consisting of acidic solutions and alkaline solutions.

In various aspects, the surface has attached thereto a plurality of nitrides to create a treated surface for enhancement of optoelectronic properties and/or solar water splitting properties. For example, the nitrides, can be selected from the group consisting of nitrides of the group-III elements such as B, Al, Ga, and In; nitrides of the transition metal elements such as Ta and Cr; and nitrides of the group-IV elements such as Si and Ge.

In various aspects, the surface has attached thereto a plurality of oxides to create a treated surface for enhancement of optoelectronic properties and/or solar water splitting properties. For example, the oxides, can be selected from the group consisting of oxides of the group-III elements such as B, Al, Ga, and In; oxides of the transition metal elements such as Ta and Cr; and oxides of the group-IV elements such as Si and Ge.

In various aspects, the surface has attached thereto a plurality of insulating compounds to create a treated surface for enhancement of optoelectronic properties and/or solar water splitting properties. Examples of insulating compounds can include parylene and polymer-based photoresists.

In some aspects, (i) the surface has been treated with a chemical solution for oxide removal selected from the group consisting of acidic solutions and alkaline solutions; (ii) the surface has attached thereto a plurality of nitrides or oxides, wherein the nitrides and oxides are selected from the group consisting of group-III elements such as B, Al, Ga, and In; transition metal elements such as Ta and Cr, and group-IV elements such as Si and Ge; and (iii) the surface has attached thereto a plurality of thiol compounds, wherein the thiol compounds are selected from the group consisting of monothiols and dithiols having from 2 to 20 carbon atoms. In any one or more aspects, the treated surface can allow for one or more of improved light extraction, electrical insulation, surface states passivation, charge carriers flow promotion/inhibition, and thermal dissipation.

In one or more aspects, the thiol compounds can have a structure according to Formula I or a derivative thereof:

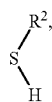

I where $R^2$ is a $C_1$-$C_{20}$ alkyl or heteroalkyl group, optionally including one or more substituents. In some aspects, the thiol compound is a short-chain thiol compound, e.g. where $R^2$ is a $C_1$-$C_3$ alkyl or heteroalkyl group, optionally including one or more substituents.

In one or more aspects, the thiol compounds can have a structure according to Formula II or a derivative thereof:

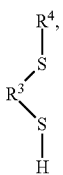

II where $R^3$ is a $C_1$-$C_{20}$ alkyl or heteroalkyl group, optionally including one or more substituents, and where $R^4$ is hydrogen or a $C_1$-$C_{20}$ alkyl or heteroalkyl group, optionally including one or more substituents. In some aspects, the thiol compound is a short-chain dithiol compound, e.g. where $R^3$ is a $C_1$-$C_3$ alkyl or heteroalkyl group, optionally including one or more substituents.

In various aspects, the thiol compounds can be used to attach one or more metal atoms to the surface of the semiconductor. In some embodiments, the semiconductor has a plurality of metal atoms coordinated to one or more of the thiol compounds. Metal atoms can include, for example, Ta, Pd, Pt, Ni, Au, Ag, Ir, or Cu.

The passivation and surface treatment techniques can be applied to a variety of semiconductor surfaces. In various aspects, the semiconductor can be a (B,Al,Ga,In,Tl)N semiconductor, a (B,Al,Ga,In,Tl)As semiconductor, a (B,Al,Ga,In,Tl)Sb semiconductor, (B,Al,Ga,In,Tl)Bi semiconductor or a (B,Al,Ga,In)P semiconductor. In various aspects, the semiconductor is a binary, ternary, quaternary, or quanternary (B,Al,Ga,In)N semiconductor alloy.

Various methods are provided for preparing the semiconductors described herein. In some aspects, the methods include cleaning a native surface of a semiconductor such as a gallium semiconductor to produce a cleaned surface, etching the cleaned surface to remove oxide layers on the surface, and applying thiol compounds to the surface to produce the semiconductor having a plurality of thiol compounds attached to the surface. In some embodiments, the methods further include applying a solution containing a metal to the thiol compounds attached to the surface to produce the gallium semiconductor further comprising a plurality of metal atoms coordinated to one or more of the thiol compounds. In some aspects, the methods include cleaning a native surface of a gallium nitride semiconductor to produce a cleaned surface, etching the cleaned surface to remove oxide layers on the surface, and applying single or multiple coatings of nitrides, oxides, insulating compounds, thiol compounds, or a combination thereof attached to the surface. The methods can include applying a coating of monolayer to 1-10000 nm containing metal or nitrides, oxides compound to achieve the desired optoelectronic properties, such as light extraction, electrical insulation, surface states passivation, charge carriers flow promotion/inhibition, and thermal dissipation. In some aspects, the coating is applied by solution dipping, physical vapor deposition, chemical vapor deposition, or photo deposition to engineer the physical and chemical properties of the surface.

Other systems, methods, features, and advantages of the gallium semiconductors and methods of making thereof will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

DETAILED DESCRIPTION

Figures 1A, 1B, 1C, 1D:
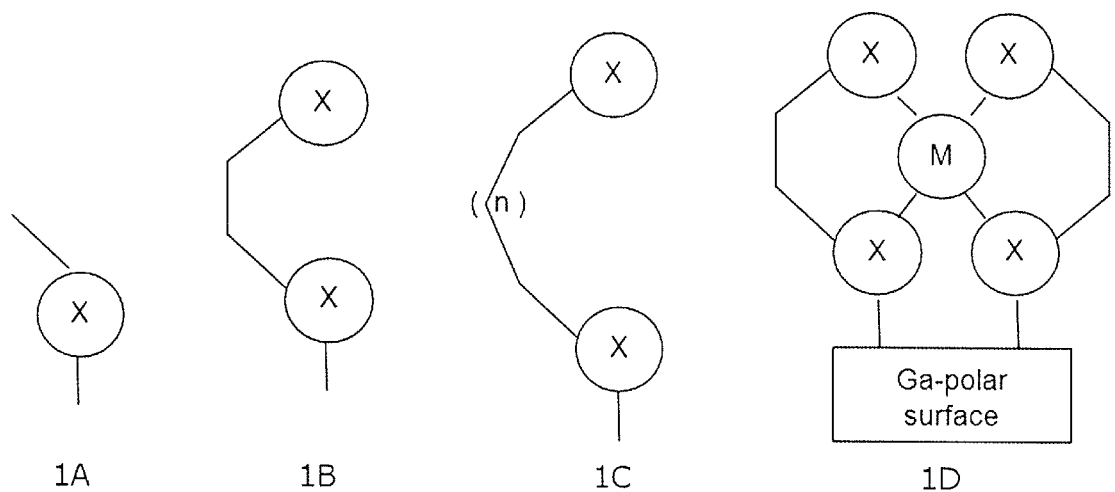
FIGS. 1A-1D are schematic representations of: short carbon-chain thiol (FIG. 1A), dithiol (FIG. 1B); long carbon-chain dithiol (FIG. 1C); and an exemplary embodiment that enables simultaneous dangling bond passivation of Ga-polar surface, and further assembly of metal catalyst (M) (FIG. 1D).

In various aspects, semiconductors having a surface passivated by thiol compounds are provided. In some embodiments, the semiconductors further have metal atoms coordinated to the thiol compounds. Methods of making the semiconductors and methods of using the semiconductors are also provided.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure and to be encompassed by the claims herein.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about y".

Definitions

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The articles "a" and "an," as used herein, mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used.

The terms "gallium semiconductor", "gallium nitride based semiconductor" and "gallium-based semiconductor," as interchangeably used herein, refer to III-V semiconductors in which gallium (Ga) is one of the elements. A gallium semiconductor can have the general formula $Al_aIn_bGa_cN_xAs_yP_z$ where a, b, c, x, y, and z are real numbers from 0 to 1; c is non-zero; a+b+c is 1, and x+y+z is 1. The semiconductors can have p-type or n-type conductivity, which can be imparted by dopants and can also result from the inherent conductivity of the particular semiconductor material. For example, gallium nitride-based semiconductors having defects typically are inherently n-type even when undoped. Conventional electron donor dopants such as Si, Ge, S, and O, can be used to impart n-type conductivity to nitride semiconductors, whereas p-type nitride semiconductors can include conventional electron acceptor dopants such as Mg and Zn.

The terms "nitride semiconductor" and "nitride-based semiconductor," as interchangeably used herein, refer to III-V semiconductors in which nitrogen (N) is one of the elements. A nitride semiconductor can have the general formula $Al_aIn_bGa_cN_xAs_yP_z$ where a, b, c, x, y, and z are real numbers from 0 to 1; x is non-zero; a+b+c is about 1, and x+y+z is about 1. The semiconductors can have p-type or n-type conductivity, which can be imparted by dopants and can also result from the inherent conductivity of the particular semiconductor material. For example, gallium nitride-based semiconductors having defects typically are inherently n-type even when undoped. Conventional electron donor dopants such as Si, Ge, S, and O, can be used to impart n-type conductivity to nitride semiconductors, whereas p-type nitride semiconductors can include conventional electron acceptor dopants such as Mg and Zn.

The term "small molecule", as used herein, generally refers to an organic molecule that is less than 2000 g/mol in molecular weight, less than 1500 g/mol, less than 1000 g/mol, less than 800 g/mol, or less than 500 g/mol. Small molecules are non-polymeric and/or non-oligomeric.

The term "hydrophilic", as used herein, refers to substances that have strongly polar groups that readily interact with water.

The term "hydrophobic", as used herein, refers to substances that lack an affinity for water; tending to repel and not absorb water as well as not dissolve in or mix with water.

The term "lipophilic", as used herein, refers to compounds having an affinity for lipids.

The term "amphiphilic", as used herein, refers to a molecule combining hydrophilic and lipophilic (hydrophobic) properties. "Amphiphilic material" as used herein refers to a material containing a hydrophobic or more hydrophobic oligomer or polymer (e.g., biodegradable oligomer or polymer) and a hydrophilic or more hydrophilic oligomer or polymer.

The term "alkyl" refers to the radical of saturated aliphatic groups, including straight-chain alkyl groups, branched-chain alkyl groups, cycloalkyl (alicyclic) groups, alkyl-substituted cycloalkyl groups, and cycloalkyl-substituted alkyl groups.

In some embodiments, a straight chain or branched chain alkyl has 30 or fewer carbon atoms in its backbone (e.g., $C_1$-$C_{30}$ for straight chains, $C_3$-$C_{30}$ for branched chains), 20 or fewer, 12 or fewer, or 7 or fewer. Likewise, in some embodiments cycloalkyls have from 3-10 carbon atoms in their ring structure, e.g. have 5, 6 or 7 carbons in the ring structure. The term "alkyl" (or "lower alkyl") as used throughout the specification, examples, and claims is intended to include both "unsubstituted alkyls" and "substituted alkyls", the latter of which refers to alkyl moieties having one or more substituents replacing a hydrogen on one or more carbons of the hydrocarbon backbone. Such substituents include, but are not limited to, halogen, hydroxyl, carbonyl (such as a carboxyl, alkoxycarbonyl, formyl, or an acyl), thiocarbonyl (such as a thioester, a thioacetate, or a thioformate), alkoxyl, phosphoryl, phosphate, phosphonate, a phosphinate, amino, amido, amidine, imine, cyano, nitro, azido, sulfhydryl, alkylthio, sulfate, sulfonate, sulfamoyl, sulfonamido, sulfonyl, heterocyclyl, aralkyl, or an aromatic or heteroaromatic moiety.

Unless the number of carbons is otherwise specified, "lower alkyl" as used herein means an alkyl group, as defined above, but having from one to ten carbons, from one to six carbon atoms, or from one to three carbon atoms in its backbone structure. Likewise, "lower alkenyl" and "lower alkynyl" have similar chain lengths. Throughout the application, preferred alkyl groups are lower alkyls. In some embodiments, a substituent designated herein as alkyl is a lower alkyl.

It will be understood by those skilled in the art that the moieties substituted on the hydrocarbon chain can themselves be substituted, if appropriate. For instance, the substituents of a substituted alkyl may include halogen, hydroxy, nitro, thiols, amino, azido, imino, amido, phosphoryl (including phosphonate and phosphinate), sulfonyl (including sulfate, sulfonamido, sulfamoyl and sulfonate), and silyl groups, as well as ethers, alkylthios, carbonyls (including ketones, aldehydes, carboxylates, and esters), —$CF_3$, —CN and the like. Cycloalkyls can be substituted in the same manner.

The term "heteroalkyl", as used herein, refers to straight or branched chain, or cyclic carbon-containing radicals, or combinations thereof, containing at least one heteroatom. Suitable heteroatoms include, but are not limited to, O, N, Si, P, Se, B, and S, wherein the phosphorous and sulfur atoms are optionally oxidized, and the nitrogen heteroatom is optionally quaternized. Heteroalkyls can be substituted as defined above for alkyl groups.

The term "alkylthio" refers to an alkyl group, as defined above, having a sulfur radical attached thereto. In some embodiments, the "alkylthio" moiety is represented by one of —S-alkyl, —S-alkenyl, and —S-alkynyl. Representative alkylthio groups include methylthio, and ethylthio. The term "alkylthio" also encompasses cycloalkyl groups, alkene and cycloalkene groups, and alkyne groups. "Arylthio" refers to aryl or heteroaryl groups. Alkylthio groups can be substituted as defined above for alkyl groups.

The terms "alkenyl" and "alkynyl", refer to unsaturated aliphatic groups analogous in length and possible substitution to the alkyls described above, but that contain at least one double or triple bond respectively.

The terms "alkoxyl" or "alkoxy" as used herein refers to an alkyl group, as defined above, having an oxygen radical attached thereto. Representative alkoxyl groups include methoxy, ethoxy, propyloxy, and tert-butoxy. An "ether" is two hydrocarbons covalently linked by an oxygen. Accordingly, the substituent of an alkyl that renders that alkyl an ether is or resembles an alkoxyl, such as can be represented by one of —O-alkyl, —O-alkenyl, and —O— alkynyl. Aroxy can be represented by —O-aryl or O-heteroaryl, wherein aryl and heteroaryl are as defined below. The alkoxy and aroxy groups can be substituted as described above for alkyl.

The terms "amine" and "amino" are art-recognized and refer to both unsubstituted and substituted amines, e.g., a moiety that can be represented by the general formula:

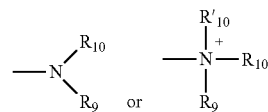

wherein $R_9$, $R_{10}$, and $R'_{10}$ each independently represent a hydrogen, an alkyl, an alkenyl, —$(CH_2)_m$—$R_8$ or $R_9$ and $R_{10}$ taken together with the N atom to which they are attached complete a heterocycle having from 4 to 8 atoms in the ring structure; $R_8$ represents an aryl, a cycloalkyl, a cycloalkenyl, a heterocycle or a polycycle; and m is zero or an integer in the range of 1 to 8. In some embodiments, only one of $R_9$ or $R_{10}$ can be a carbonyl, e.g., $R_9$, $R_{10}$ and the nitrogen together do not form an imide. In still other embodiments, the term "amine" does not encompass amides, e.g., wherein one of $R_9$ and $R_{10}$ represents a carbonyl. In additional embodiments, $R_9$ and $R_{10}$ (and optionally $R'_{10}$) each independently represent a hydrogen, an alkyl or cycloalkyl, an alkenyl or cycloalkenyl, or alkynyl. Thus, the term "alkylamine" as used herein means an amine group, as defined above, having a substituted (as described above for alkyl) or unsubstituted alkyl attached thereto, i.e., at least one of $R_9$ and $R_{10}$ is an alkyl group.

The term "amido" is art-recognized as an amino-substituted carbonyl and includes a moiety that can be represented by the general formula:

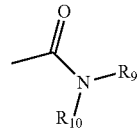

wherein $R_9$ and $R_{10}$ are as defined above.

"Aryl", as used herein, refers to $C_5$-$C_{10}$-membered aromatic, heterocyclic, fused aromatic, fused heterocyclic, biaromatic, or bihetereocyclic ring systems. Broadly defined, "aryl", as used herein, includes 5-, 6-, 7-, 8-, 9-, and 10-membered single-ring aromatic groups that may include from zero to four heteroatoms, for example, benzene, pyrrole, furan, thiophene, imidazole, oxazole, thiazole, triazole, pyrazole, pyridine, pyrazine, pyridazine and pyrimidine, and the like. Those aryl groups having heteroatoms in the ring structure may also be referred to as "aryl heterocycles" or "heteroaromatics". The aromatic ring can be substituted at one or more ring positions with one or more substituents including, but not limited to, halogen, azide, alkyl, aralkyl, alkenyl, alkynyl, cycloalkyl, hydroxyl, alkoxyl, amino (or quaternized amino), nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —$CF_3$, —CN; and combinations thereof.

The term "aryl" also includes polycyclic ring systems having two or more cyclic rings in which two or more carbons are common to two adjoining rings (i.e., "fused rings") wherein at least one of the rings is aromatic, e.g., the other cyclic ring or rings can be cycloalkyls, cycloalkenyls, cycloalkynyls, aryls and/or heterocycles. Examples of heterocyclic rings include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH carbazolyl, carbolinyl, chromanyl, chromenyl, cinnolinyl, decahydroquinolinyl, 2H,6H-1,5,2-dithiazinyl, dihydrofuro[2,3 b]tetrahydrofuran, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, morpholinyl, naphthyridinyl, octahydroisoquinolinyl, oxadiazolyl, 1,2,3-oxadiazolyl, 1,2,4-oxadiazolyl, 1,2,5-oxadiazolyl, 1,3,4-oxadiazolyl, oxazolidinyl, oxazolyl, oxindolyl, pyrimidinyl, phenanthridinyl, phenanthrolinyl, phenazinyl, phenothiazinyl, phenoxathinyl, phenoxazinyl, phthalazinyl, piperazinyl, piperidinyl, piperidonyl, 4-piperidonyl, piperonyl, pteridinyl, purinyl, pyranyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, 2H-pyrrolyl, pyrrolyl, quinazolinyl, quinolinyl, 4H-quinolizinyl, quinoxalinyl, quinuclidinyl, tetrahydrofuranyl, tetrahydroisoquinolinyl, tetrahydropyranyl, tetrahydroquinolinyl, tetrazolyl, 6H-1,2,5-thiadiazinyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. One or more of the rings can be substituted as defined above for "aryl".

The term "aralkyl", as used herein, refers to an alkyl group substituted with an aryl group (e.g., an aromatic or heteroaromatic group).

The term "carbocycle", as used herein, refers to an aromatic or non-aromatic ring in which each atom of the ring is carbon.

"Heterocycle" or "heterocyclic", as used herein, refers to a cyclic radical attached via a ring carbon or nitrogen of a monocyclic or bicyclic ring containing 3-10 ring atoms, and preferably from 5-6 ring atoms, consisting of carbon and one to four heteroatoms each selected from the group consisting of non-peroxide oxygen, sulfur, and N(Y) wherein Y is absent or is H, O, ($C_1$-$C_{10}$) alkyl, phenyl or benzyl, and optionally containing 1-3 double bonds and optionally substituted with one or more substituents. Examples of heterocyclic ring include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH-carbazolyl, carbolinyl, chromanyl, chromenyl, cinnolinyl, decahydroquinolinyl, 2H,6H-1,5,2-dithiazinyl, dihydrofuro[2,3-b]tetrahydrofuran, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, morpholinyl, naphthyridinyl, octahydroisoquinolinyl, oxadiazolyl, 1,2,3-oxadiazolyl, 1,2,4-oxadiazolyl, 1,2,5-oxadiazolyl, 1,3,4-oxadiazolyl, oxazolidinyl, oxazolyl, oxepanyl, oxetanyl, oxindolyl, pyrimidinyl, phenanthridinyl, phenanthrolinyl, phenazinyl, phenothiazinyl, phenoxathinyl, phenoxazinyl, phthalazinyl, piperazinyl, piperidinyl, piperidonyl, 4-piperidonyl, piperonyl, pteridinyl, purinyl, pyranyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, 2H-pyrrolyl, pyrrolyl, quinazolinyl, quinolinyl, 4H-quinolizinyl, quinoxalinyl, quinuclidinyl, tetrahydrofuranyl, tetrahydroisoquinolinyl, tetrahydropyranyl, tetrahydroquinolinyl, tetrazolyl, 6H-1,2,5-thiadiazinyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. Heterocyclic groups can optionally be substituted with one or more substituents at one or more positions as defined above for alkyl and aryl, for example, halogen, alkyl, aralkyl, alkenyl, alkynyl, cycloalkyl, hydroxyl, amino, nitro, sulfhydryl, imino, amido, phosphate, phosphonate, phosphinate, carbonyl, carboxyl, silyl, ether, alkylthio, sulfonyl, ketone, aldehyde, ester, a heterocyclyl, an aromatic or heteroaromatic moiety, —CF3, and —CN.

The term "carbonyl" is art-recognized and includes such moieties as can be represented by the general formula:

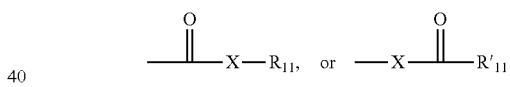

wherein X is a bond or represents an oxygen or a sulfur, and $R_{11}$ represents a hydrogen, an alkyl, a cycloalkyl, an alkenyl, an cycloalkenyl, or an alkynyl, $R'_{11}$ represents a hydrogen, an alkyl, a cycloalkyl, an alkenyl, an cycloalkenyl, or an alkynyl. Where X is an oxygen and $R_{11}$ or $R'_{11}$ is not hydrogen, the formula represents an "ester". Where X is an oxygen and $R_{11}$ is as defined above, the moiety is referred to herein as a carboxyl group, and particularly when $R_{11}$ is a hydrogen, the formula represents a "carboxylic acid". Where X is an oxygen and $R'_{11}$ is hydrogen, the formula represents a "formate". In general, where the oxygen atom of the above formula is replaced by sulfur, the formula represents a "thiocarbonyl" group. Where X is a sulfur and $R_{11}$ or $R'_{11}$ is not hydrogen, the formula represents a "thioester." Where X is a sulfur and $R_{11}$ is hydrogen, the formula represents a "thiocarboxylic acid." Where X is a sulfur and $R'_{11}$ is hydrogen, the formula represents a "thioformate." On the other hand, where X is a bond, and $R_{11}$ is not hydrogen, the above formula represents a "ketone" group. Where X is a bond, and $R_{11}$ is hydrogen, the above formula represents an "aldehyde" group.

The term "monoester" as used herein refers to an analogue of a dicarboxylic acid wherein one of the carboxylic acids is functionalized as an ester and the other carboxylic acid is a free carboxylic acid or salt of a carboxylic acid. Examples of monoesters include, but are not limited to, to monoesters of succinic acid, glutaric acid, adipic acid, suberic acid, sebacic acid, azelaic acid, oxalic and maleic acid.

The term "heteroatom" as used herein means an atom of any element other than carbon or hydrogen. Examples of heteroatoms are boron, nitrogen, oxygen, phosphorus, sulfur and selenium. Other heteroatoms include silicon and arsenic.

As used herein, the term "nitro" means —$NO_2$; the term "halogen" designates —F, —Cl, —Br or —I; the term "sulfhydryl" means —SH; the term "hydroxyl" means —OH; and the term "sulfonyl" means —$SO_2$—.

The term "substituted" as used herein, refers to all permissible substituents of the compounds described herein. In the broadest sense, the permissible substituents include acyclic and cyclic, branched and unbranched, carbocyclic and heterocyclic, aromatic and nonaromatic substituents of organic compounds. Illustrative substituents include, but are not limited to, halogens, hydroxyl groups, or any other organic groupings containing any number of carbon atoms, preferably 1-14 carbon atoms, and optionally include one or more heteroatoms such as oxygen, sulfur, or nitrogen grouping in linear, branched, or cyclic structural formats. Representative substituents include alkyl, substituted alkyl, alkenyl, substituted alkenyl, alkynyl, substituted alkynyl, phenyl, substituted phenyl, aryl, substituted aryl, heteroaryl, substituted heteroaryl, halo, hydroxyl, alkoxy, substituted alkoxy, phenoxy, substituted phenoxy, aroxy, substituted aroxy, alkylthio, substituted alkylthio, phenylthio, substituted phenylthio, arylthio, substituted arylthio, cyano, isocyano, substituted isocyano, carbonyl, substituted carbonyl, carboxyl, substituted carboxyl, amino, substituted amino, amido, substituted amido, sulfonyl, substituted sulfonyl, sulfonic acid, phosphoryl, substituted phosphoryl, phosphonyl, substituted phosphonyl, polyaryl, substituted polyaryl, $C_3$-$C_{20}$ cyclic, substituted $C_3$-$C_{20}$ cyclic, heterocyclic, substituted heterocyclic, aminoacid, peptide, and polypeptide groups.

Heteroatoms such as nitrogen may have hydrogen substituents and/or any permissible substituents of organic compounds described herein which satisfy the valences of the heteroatoms. It is understood that "substitution" or "substituted" includes the implicit proviso that such substitution is in accordance with permitted valence of the substituted atom and the substituent, and that the substitution results in a stable compound, i.e. a compound that does not spontaneously undergo transformation such as by rearrangement, cyclization, elimination, etc.

In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. The heteroatoms such as nitrogen may have hydrogen substituents and/or any permissible substituents of organic compounds described herein which satisfy the valencies of the heteroatoms.

In various embodiments, the substituent is selected from alkoxy, aryloxy, alkyl, alkenyl, alkynyl, amide, amino, aryl, arylalkyl, carbamate, carboxy, cyano, cycloalkyl, ester, ether, formyl, halogen, haloalkyl, heteroaryl, heterocyclyl, hydroxyl, ketone, nitro, phosphate, sulfide, sulfinyl, sulfonyl, sulfonic acid, sulfonamide, and thioketone, each of which optionally is substituted with one or more suitable substituents. In some embodiments, the substituent is selected from alkoxy, aryloxy, alkyl, alkenyl, alkynyl, amide, amino, aryl, arylalkyl, carbamate, carboxy, cycloalkyl, ester, ether, formyl, haloalkyl, heteroaryl, heterocyclyl, ketone, phosphate, sulfide, sulfinyl, sulfonyl, sulfonic acid, sulfonamide, and thioketone, wherein each of the alkoxy, aryloxy, alkyl, alkenyl, alkynyl, amide, amino, aryl, arylalkyl, carbamate, carboxy, cycloalkyl, ester, ether, formyl, haloalkyl, heteroaryl, heterocyclyl, ketone, phosphate, sulfide, sulfinyl, sulfonyl, sulfonic acid, sulfonamide, and thioketone can be further substituted with one or more suitable substituents.

Examples of substituents include, but are not limited to, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, thioketone, ester, heterocyclyl, —CN, aryl, aryloxy, perhaloalkoxy, aralkoxy, heteroaryl, heteroaryloxy, heteroarylalkyl, heteroaralkoxy, azido, alkylthio, oxo, acylalkyl, carboxy esters, carboxamido, acyloxy, aminoalkyl, alkylaminoaryl, alkylaryl, alkylaminoalkyl, alkoxyaryl, arylamino, aralkylamino, alkylsulfonyl, carboxamidoalkylaryl, carboxamidoaryl, hydroxyalkyl, haloalkyl, alkylaminoalkylcarboxy, aminocarboxamidoalkyl, cyano, alkoxyalkyl, perhaloalkyl, arylalkyloxyalkyl, and the like. In some embodiments, the substituent is selected from cyano, halogen, hydroxyl, and nitro.

Semiconductors

A variety of semiconductors are provided having a surface passivated by one or more thiol compounds. The semiconductor surface can include a surface that has been cleaned and has been etched to remove oxide layers on the surface. The surface can have a plurality of thiol compounds attached thereto. The thiol compounds can form a thin layer, in some aspects a self-assembled monolayer, on the surface of the semiconductor. The semiconductors include, but are not limited to, nanostructures, planar thin films, and bulk semiconductor materials. In various aspects, the semiconductor surface can be free or essentially free of surface localized defect states originating from dangling bonds, nitrogen vacancies, and/or surface oxides.

The molecular passivation process is applicable to various semiconductor materials, such as but not limited to nitride-, arsenide-, phosphide-, antimonide-based devices, including but not limited to LED, laser, solar cells, water splitting, photodetector, optical modulators and high-power transistors.

In various aspects, the semiconductor is a gallium nitride based semiconductor. A variety of gallium nitride semiconductors can be used in the present disclosure. In some aspects, the semiconductor is a (Al,Ga,In)N semiconductor, a (Al,Ga,In)As semiconductor, or a (Al,Ga,In)P semiconductor. In some aspects, the semiconductor has the general formula $B_a Al_b Ga_c In_c In_d Tl_e N_w P_x As_y Bi_z$ where a, b, c, d, e, w, x, y, and z are all real numbers from 0 to 1, where a+b+c+d+e is about 1, and where w+x+y+z is about 1. In some aspects, the semiconductor is a gallium semiconductor where c is non-zero. In various aspects, a, b, c, d, e, w, x, y, and z are each independently selected from the group of real number from about 0 to 0.2, real number from about 0.2 to 0.4, real numbers from about 0.4 to 0.6, real numbers from about 0.6 to 0.8, real numbers from about 0.8 to 1.0, and combinations thereof, so long as a+b+c+d+e is about 1 and w+x+y+z is about 1.

A variety of thiol compounds can be attached to the surface of the semiconductor. In various aspects, one or more of the thiol compounds is a monothiol, a dithiol, or a polythiol containing 3 or more thiol groups. The thiol compounds can be small molecules. In various aspects, the thiol compound is a short-chain thiol, meaning that the thiol group is bonded to a lower alkyl, lower alkenyl, or lower alkynyl group. The thiol compound can be, for example, a monothiol or a dithiol having from 1 to 30 carbon atoms, from 2 to 30 carbon atoms, from 2 to 20 carbon atoms, from 3 to 20 carbon atoms, from 3 to 12 carbon atoms, or from 1 to 3 carbon atoms. Examples of thiol compounds can include 1,2-ethanedithiol (EDT), 1-Pentanethiol, 1-Nonanethiol, derivatives thereof, and combinations thereof.

The thiol compounds can include compounds having a structure according to Formula I or a derivative thereof:

I where $R^2$ is an alkyl, alkenyl, alkynyl, cycloalkyl, heterocyclyl, aryl, and heteroaryl, wherein each of the alkyl, alkenyl, alkynyl, cycloalkyl, heterocyclyl, aryl, and heteroaryl groups optionally is substituted with one or more groups, each independently selected from halogen, cyano, nitro, hydroxyl, ester, ether, alkoxy, aryloxy, amino, amide, carbamate, alkyl, alkenyl, alkynyl, aryl, arylalkyl, cycloalkyl, heteroaryl, heterocyclyl, oxo, phosphono, phosphate, sulfide, sulfinyl, sulfino, sulfonyl, sulfo, and sulfonamide, wherein each of the ester, ether, alkoxy, aryloxy, amino, amide, carbamate, alkyl, alkenyl, alkynyl, aryl, arylalkyl, cycloalkyl, heteroaryl, heterocyclyl, phosphono, phosphate, sulfide, sulfinyl, sulfino, sulfonyl, sulfo, and sulfonamide is optionally substituted with one or more suitable substituents. In some aspects, R2 is a $C_1$-$C_{30}$, $C_1$-$C_{20}$, $C_1$-$C_{12}$, $C_1$-$C_3$, $C_3$-$C_{12}$, or $C_3$-$C_{20}$ alkyl or heteroalkyl group, optionally including one or more substituents.

The thiol compounds can include compounds having a structure according to Formula II or a derivative thereof:

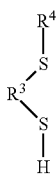

II where $R^3$ is an alkyl, alkenyl, alkynyl, cycloalkyl, heterocyclyl, aryl, and heteroaryl, wherein each of the alkyl, alkenyl, alkynyl, cycloalkyl, heterocyclyl, aryl, and heteroaryl groups optionally is substituted with one or more groups, each independently selected from halogen, cyano, nitro, hydroxyl, ester, ether, alkoxy, aryloxy, amino, amide, carbamate, alkyl, alkenyl, alkynyl, aryl, arylalkyl, cycloalkyl, heteroaryl, heterocyclyl, oxo, phosphono, phosphate, sulfide, sulfinyl, sulfino, sulfonyl, sulfo, and sulfonamide, wherein each of the ester, ether, alkoxy, aryloxy, amino, amide, carbamate, alkyl, alkenyl, alkynyl, aryl, arylalkyl, cycloalkyl, heteroaryl, heterocyclyl, phosphono, phosphate, sulfide, sulfinyl, sulfino, sulfonyl, sulfo, and sulfonamide is optionally substituted with one or more suitable substituents, and where $R^4$ is hydrogen or an alkyl, alkenyl, alkynyl, cycloalkyl, heterocyclyl, aryl, and heteroaryl, wherein each of the alkyl, alkenyl, alkynyl, cycloalkyl, heterocyclyl, aryl, and heteroaryl groups optionally is substituted with one or more groups, each independently selected from halogen, cyano, nitro, hydroxyl, ester, ether, alkoxy, aryloxy, amino, amide, carbamate, alkyl, alkenyl, alkynyl, aryl, arylalkyl, cycloalkyl, heteroaryl, heterocyclyl, oxo, phosphono, phosphate, sulfide, sulfinyl, sulfino, sulfonyl, sulfo, and sulfonamide, wherein each of the ester, ether, alkoxy, aryloxy, amino, amide, carbamate, alkyl, alkenyl, alkynyl, aryl, arylalkyl, cycloalkyl, heteroaryl, heterocyclyl, phosphono, phosphate, sulfide, sulfinyl, sulfino, sulfonyl, sulfo, and sulfonamide is optionally substituted with one or more suitable substituents. In some aspects, $R^3$ and $R^4$ are each independently a $C_1$-$C_{30}$, $C_1$-$C_{20}$, $C_1$-$C_{12}$, $C_1$-$C_3$, $C_3$-$C_{12}$, or $C_3$-$C_{20}$ alkyl or heteroalkyl group, optionally including one or more substituents.

In some embodiments, the semiconductors further include metal atoms coordinated to one or more thiol compounds on the surface. The metal atoms can include, for example, Pd, Pt, Ni, Au, Ag and Cu.

Methods of Making Semiconductors

A variety of methods are provided for making the semiconductors provided here. The present disclosure involves a versatile and facile passivation process method for gallium semiconductors, such as gallium nitride optoelectronic and electronic devices to terminate the metal-polar surface dangling bond in these materials, and in other applications simultaneous self-assembly of molecular passivation layer and attachment of molecular catalyst in a conformal manner, thereby uses less material and save cost (molecular thickness on the targeted sites of Ga, as compared to several nanometers across the deposition chuck; conformal versus sparse- or lumpy-coating) for the same process.

The facile method can include dipping the nanowires in a short carbon-chain (FIG. 1A, 1B) or long carbon-chain (FIG. 1C) organic sulphide solution, either thiol (FIG. 1A) or dithiol (FIG. 1B) species that bonds with the gallium polar sidewalls of nitride nanowires or similar surfaces, to achieve improvement in nanowires-based devices, as shown in the following figures. X, n, and M represents the thiol group (—SH) or other functional group such as —NH₂ or a mixture of functional groups, the integer number of carbon for the organic passivation solutions, the metal catalyst self-assembled by dipping the sample in metal-catalyst containing organic solutions, respectively. An exemplary self-assembly of molecular passivation and molecular catalyst attachment is shown in FIG. 1D. The minimum usage of metal catalyst and cost saving will be apparent when one examine the exemplary scheme in FIG. 1D.

The present disclosure allows the flexibility of using short carbon-chain thiol or dithiol species for minority carrier devices, such as water-splitting, photodetector, and solar cell applications. This mitigates the side-effects of the use of long carbon chain polymers deposition leading to relatively thick carbon-polymer coating of the nanowires, and hence either preventing low resistance carrier transfer in water splitting or reduced effective light absorption in water splitting and photodetector applications, thus highlighting the advantage of short chain thiol species.

Further functionalization of the nanowires was achieved using dithiol solution for the case of semiconductor sensing, and/or water splitting applications, in which one end of the thiol bonds with the Ga sites on the nitride materials, while the other end of the thiol bonds with metal catalyst. Herein we demonstrate a few-minute-passivation technique of the (Al,Ga,In)N-based nanowires through the use of a short-carbon chain thiol compound, such as 1,2-ethanedithiol (EDT), 1-Pentanethiol and 1-Nonanethiol. The Ga-thiol bonds in the dithiol species also allow for metal catalyst (M), such as Pd and Pt, most importantly Ni that is earth-abundant and low cost, to be embedded based on metal-catalyst containing organic solutions, thereby reducing the expensive metal used.

Figure 2A:
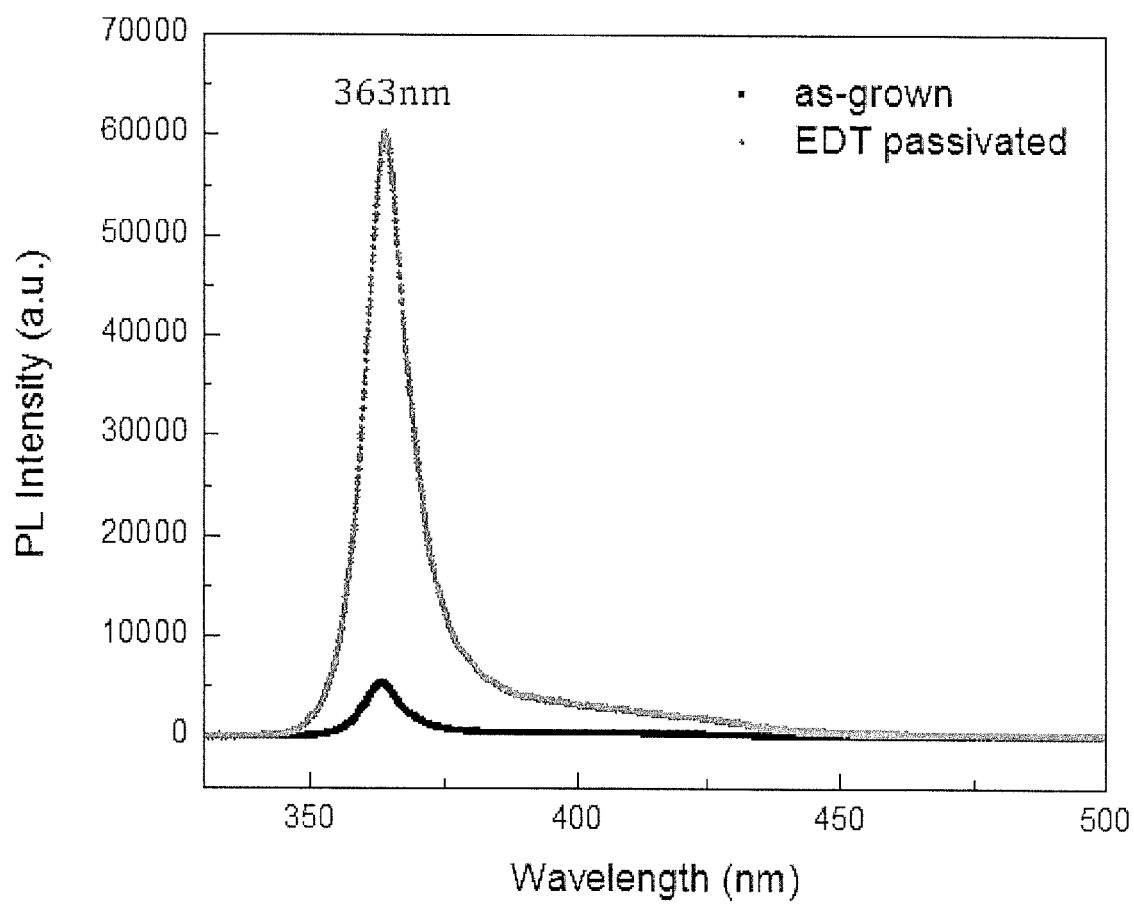
FIGS. 2A-2B demonstrate improvement in PL intensity with respect to as-grown GaN for EDT passivated GaN (FIG. 2A) and a bar chart of the peak photoluminescence intensity for passivation with different chemical solutions (FIG. 2B).
Figure 3:
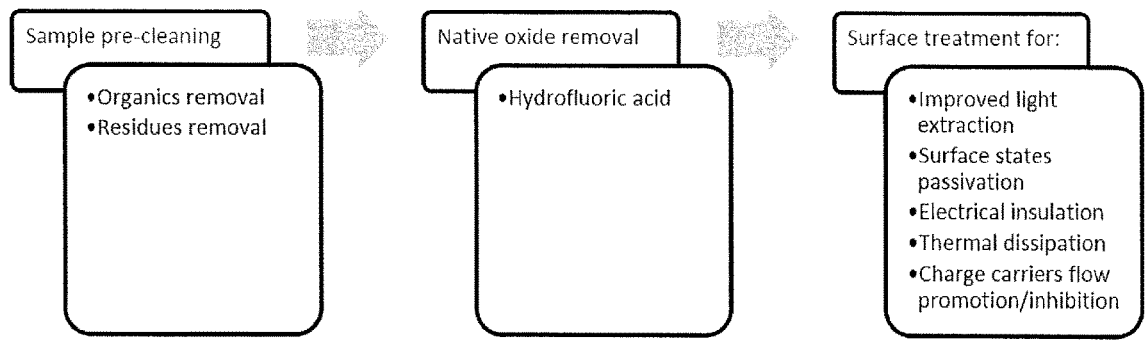
FIG. 3 is a flow diagram of one embodiments of a method for surface state passivation.

In an exemplary embodiment, the methods include the passivation-induced efficiency enhancement process depicted in FIG. 3 including (i) solvent cleaning, (ii) oxide dissolution in HF, and (iii) chemical passivation involving EDT or thiol containing solution dipping. Using this methods, for example, the photoluminescence of nanowires are improved within minutes and devices can be then be fabricated with demonstrated improvement in efficiency. For example, in FIG. 2A the photoluminescence intensity of as-grown and EDT passivated p-GaN nanowires demonstrates an intensity difference of ~55000 a.u due to the surface states passivation that increases the radiative recombination.

Figure 4:
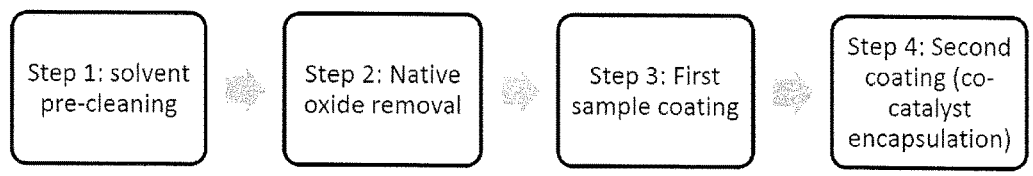
FIG. 4 is a flow diagram of one embodiments of a method for passivation and co-catalyst incorporation.

In an exemplary embodiment for surface functionalization, the methods can include the process depicted in FIG. 4, including (i) solvent cleaning, (ii) oxide dissolution in HF, and (iii) chemical passivation involving EDT or thiol containing solution dipping, and (iv) dipping in metal catalyst containing organic solution, for example $Pd(CH_3CO_2)_2$, to embed the catalyst within the dithiol species.

In various aspects, the methods include cleaning a native surface of a gallium semiconductor to produce a cleaned surface. The cleaning can include rinsing with solvents such as acetone to remove organic molecules from the surface. In various aspects, the methods further include etching the cleaned surface to remove oxide layers on the surface. A variety of procedures are known for etching semiconductor oxide surfaces. The etching can include either chemical etching or a dry etching. The etching can include exposure to strong acids such as HF. The methods can include applying thiol compounds to the surface to produce the gallium semiconductor having a plurality of thiol compounds attached to the surface. The application of the thiol compounds can be by dipping the surface into a solution containing the thiol compounds. The thiol compounds can then self-assemble to form a monolayer on the surface of the semiconductor.

In various aspects, the methods include applying a solution containing a metal to the thiol compounds on the surface of the semiconductor. The solution can contain a metal-ligand species such as $Pd(CH_3CO_2)_2$. A variety of metals can be added to the surface in this manner including, for example, Pd, Pt, Ni, Au, Ag and Cu.

Semiconductor Applications

The semiconductors having surface passivation and/or having metal functionalization on the surface can be used in a variety of electronic, optoelectronic, and catalytic processes. The semiconductors can be used in for LED, PD, optical modulator, and solar cell optoelectronic applications, where the present technique can considerably reduce the Shockley-Read-Hall recombination, thereby improving device efficiencies. For LED applications, the semiconductors can help to extend the emission to light wavelength, beyond 520 nm, coined the green-gap or the efficiency gap For water splitting, the method can render the surface states less effective, and thereby reducing the nanowires sidewall surface recombination. The present method relieves the reported method of utilizing increasing Mg doping in InGaN nanowires, which led to reducing crystal quality and water splitting efficiency, in achieving close to flat-energy-band conditions in reducing the difference between the Fermi level ($E_F$) and the valence band maximum ($E_V$), thereby lowering the potential barrier for hole extraction.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Figure 2B:
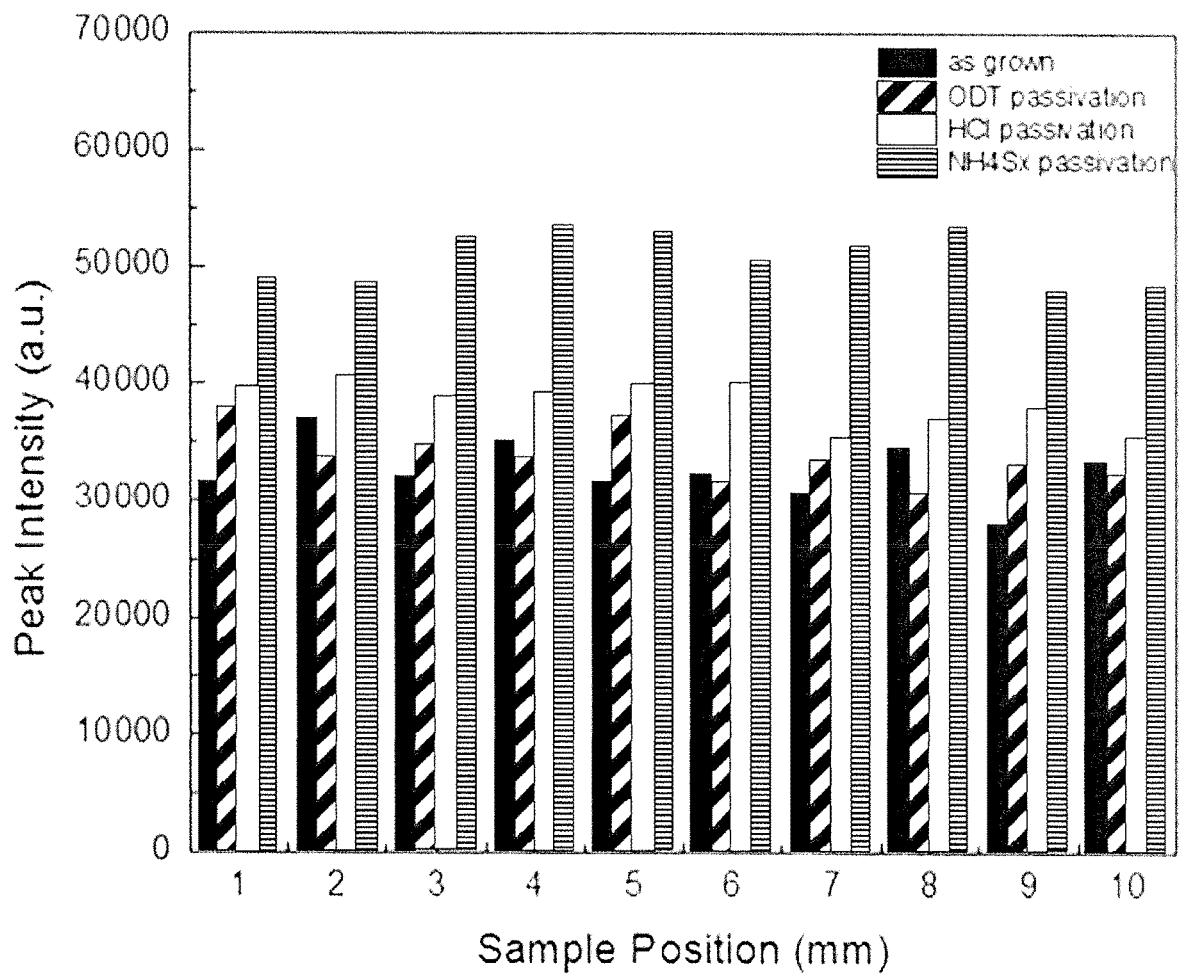

For photoelectrochemical (PEC) water splitting, the passivation of the surface trapping states is a prerequisite for high efficiency. The EDT compound achieved a simultaneous passivation of the surface dangling bonds with high quality. After the passivation of the carrier trapping states at the surface, oxygen evolving molecular cocatalysts have been deposited by dip coating to enhance the extraction of photo-generated charge carriers. Typically, the photoluminescent (PL) intensity also increases after passivation, as shown in FIGS. 2A-2B for GaN nanowires.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim:

1. A gallium nitride based semiconductor comprising a surface having attached thereto a plurality of thiol compounds for enhancement of optoelectronic properties and/or solar water splitting properties, wherein the thiol compounds are selected from the group consisting of monothiols having from 1 to 7 carbon atoms and dithiols having from 1 to 20 carbon atoms, and wherein the thiol compounds include at least one of said dithiols, the at least one dithiol having one end that bonds to Ga sites and another end that bonds to a metal catalyst.

2. The gallium nitride based semiconductor of claim 1, wherein one or more of the thiol compounds is selected from the group consisting of 1,2-ethanedithiol (EDT), 1-Pentanethiol, derivatives thereof, and combinations thereof.

3. The gallium nitride based semiconductor of claim 1, wherein the metal catalyst includes metal atoms selected from the group consisting of Ta, Ir, Pd, Pt, Ni, Au, Ag and Cu.

4. The gallium nitride semiconductor of claim 1, wherein the semiconductor is selected from the group consisting of binary, quaternary, quinternary, and ternary (B, Al,Ga,In)N semiconductor alloys.

5. The gallium nitride based semiconductor of claim 1, wherein one or more of the thiol compounds have a structure according to formula I, formula II, a derivative thereof, or a combination thereof:

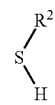

I

-continued

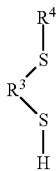

wherein $R^2$ is a $C_1$-$C_7$ alkyl or heteroalkyl group, optionally including one or more substituents, wherein $R^3$ is a $C_1$-$C_{20}$ alkyl or heteroalkyl group, optionally including one or more substituents, and wherein $R^4$ is hydrogen or a $C_1$-$C_{20}$ alkyl or heteroalkyl group, optionally including one or more substituents.

6. The gallium nitride based semiconductor of claim 5, wherein one or both of $R^2$ and $R^3$ is a $C_1$-$C_3$ alkyl or heteroalkyl group, optionally including one or more substituents.

7. The gallium nitride based semiconductor of claim 1, wherein the gallium nitride based semiconductor includes GaN nanowires and wherein the surface includes gallium polar sidewalls.

8. The gallium nitride based semiconductor of claim 1, wherein the surface is essentially free of surface localized defect states originating from dangling bonds.

9. The gallium nitride based semiconductor of claim 1, wherein the surface is essentially free of surface localized defect states originating from one or more of nitrogen vacancies and surface oxides.

10. A method of making a gallium nitride semiconductor according to claim 1, the method comprising cleaning a native surface of a gallium nitride semiconductor to produce a cleaned surface, etching the cleaned surface to remove oxide layers on the surface, and applying one or more coatings of thiol compounds to the surface to produce the gallium nitride semiconductor having a plurality of thiol compounds attached to the surface.

11. The method of claim 10, further comprising applying a coating of monolayer to 1-10000 nm containing metals nitrides, oxides, and/or insulating compounds to improve one or more of light extraction, electrical insulation, surface states passivation, charge carriers flow promotion/inhibition, and thermal dissipation.

12. The method of claim 11, wherein the coating is achieved by solution dipping, physical vapor deposition, chemical vapor deposition, or photo deposition to engineer the physical and chemical properties of the surface.

13. A gallium nitride based semiconductor comprising a surface:

(a) wherein the surface has been treated with chemical solution for native oxide removal and wherein the surface has attached thereto a plurality of thiol compounds and optionally one or more of a plurality of nitrides, a plurality of oxides, and a plurality of insulating compounds to create a treated surface for enhancement of optoelectronic properties and/or solar water splitting properties, wherein the thiol compounds are selected from the group consisting of monothiols having from 1 to 7 carbon atoms and dithiols having from 1 to 20 carbon atoms and wherein the thiol compounds include at least one of said dithiols, the at least one dithiol having one end that bonds to Ga sites and another end that bonds to a metal catalyst; and (b) wherein the treated surface allows for one or more of improved light extraction, electrical insulation, surface states passivation, charge carriers flow promotion/inhibition, and thermal dissipation.

14. The gallium nitride based semiconductor of claim 13, wherein the chemical solution for oxide removal is selected from the group consisting of acidic solutions and alkaline solutions.

15. The gallium nitride based semiconductor of claim 13, wherein the nitrides and/or oxides are selected from the group consisting of group-III elements, transition metal elements, and group-IV elements.

16. The gallium nitride based semiconductor of claim 13, wherein the insulating compounds are selected from the group consisting of parylene and polymer-based photoresists.

17. The gallium nitride based semiconductor of claim 13, (i) wherein the surface has been treated with a chemical solution for oxide removal selected from the group consisting of acidic solutions and alkaline solutions;

(ii) wherein the surface has attached thereto a plurality of nitrides or oxides, wherein the nitrides and oxides are selected from the group consisting of B, Al, Ga, In, Ta, —Cr, Si, and Ge; and (iii) wherein the surface has attached thereto a plurality of thiol compounds, wherein the thiol compounds are selected from the group consisting of monothiols and dithiols having from 1 to 3 carbon atoms.

18. A method of making a gallium nitride semiconductor according to claim 13, the method comprising cleaning a native surface of a gallium nitride semiconductor to produce a cleaned surface, etching the cleaned surface to remove oxide layers on the surface, and applying single or multiple coatings of nitrides, oxides, insulating compounds, thiol compounds, or a combination thereof attached to the surface.

19. The method of claim 18, further comprising applying a coating of monolayer to 1-10000 nm containing metals nitrides, oxides, and/or insulating compounds to improve one or more of light extraction, electrical insulation, surface states passivation, charge carriers flow promotion/inhibition, and thermal dissipation.

20. The method of claim 19, wherein the coating is applied by solution dipping, physical vapor deposition, chemical vapor deposition, or photo deposition to engineer the physical and chemical properties of the surface.

* * * * *